United States Patent [19]

McCann et al.

[11] 4,280,141

[45] Jul. 21, 1981

[54] TIME DELAY AND INTEGRATION DETECTORS USING CHARGE TRANSFER DEVICES

[76] Inventors: David H McCann, Ellicott; Marvin H. White, Columbia; Alfred P. Turly, Glen Burnie, all of Md.; Robert A. Frosch, Administrator of the National Aeronautics and Space Administration, with respect to an invention of David H. McCann, Marvin H. White, Alfred P. Turly

[21] Appl. No.: 945,043

[22] Filed: Sep. 22, 1978

[51] Int. Cl.³ .................. H04N 3/15; H04N 7/18
[52] U.S. Cl. .................................. 358/213; 358/109
[58] Field of Search .............. 358/213, 109; 357/24, 357/30

[56] References Cited

U.S. PATENT DOCUMENTS

| | | | |
|---|---|---|---|
| 3,904,818 | 9/1975 | Kovac | 358/213 |
| 3,931,463 | 1/1976 | Levine | 358/213 |

OTHER PUBLICATIONS

Thompson et al., "Time-Delay-And-Integration Charge-Coupled Devices Using Tin Oxide Gate Technology," *IEEE Transactions on Electron Devices*, vol. ED-25, No. 2, Feb. 1978, pp. 132-134.
Tompsett et al., "Charge-Coupling Improves Its Image, Challenging Video Camera Tubes," *Electronics*, Jan. 18, 1973, pp. 162-169.
Brown et al., "Transparent Metal Oxide Electrode CID Imager," *IEEE Journal of Solid State Circuits*, vol. SC-11, No. 1, Feb. 1976, pp. 128-132.
McCann et al., "Buried Channel CCD Imaging Arrays with Tin Oxide Transparent Gates," 1978 IEEE International Solid-State Circuits Conference, pp. 30, 31, 261, 262.

*Primary Examiner*—John C. Martin
*Attorney, Agent, or Firm*—John O. Tresansky; John R. Manning; Ronald F. Sandler

[57] ABSTRACT

An imaging system comprising a multi-channel matrix array of CCD devices wherein a plurality of sensor cells (pixels) in each channel are subdivided and operated in discrete intercoupled groups or subarrays with a readout CCD shift register terminating each end of the channels. Clock voltages are applied to the subarrays and are manipulated to selectively cause charge signal flow in each subarray in either direction independent of the other subarrays. More particularly, the array is divided into six independent subarrays, three on each side of the array, such that each channel common to three subarrays is divided into three sections of three sensor cells each. By selective application of four phase clock voltages, either one, two or all three of the sections cause charge signal flow in one direction, while the remainder cause charge signal flow in the opposite direction. This creates a form of selective electronic exposure control which provides an effective variable time delay and integration of three, six or nine sensor cells or integration stages. The device is constructed on a semiconductor sustrate with a buried channel and is adapted for front surface imaging through transparent doped tin oxide gates.

18 Claims, 4 Drawing Figures

TIME DELAY AND INTEGRATION DETECTORS USING CHARGE TRANSFER DEVICES

ORIGIN OF INVENTION

The invention described herein was made partly in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates generally to charge coupled device (CCD) technology and more particularly to an imaging array which operates in the time delay and integration mode.

Moving platforms incorporating solid state imaging apparatus are well known. Orbiting satellites, for example, provide platforms for remote sensing of the earth's surface. In one type of imaging apparatus, the earth's surface is scanned in one orthogonal direction by the motion of the platform and in another orthogonal direction by a moving mirror, with the resulting image being directed to an array of point detectors. The detectors review this image in one or more spectral bands in the visible to near infra-red region. Conventionally, the point detectors each have their own preamplifier and video channel. Image planes containing up to five spectral bands, including for example up to 20 detectors per band, however, are mechanically complex, and power consuming. In addition at the data rates and resolution required, they exhibit a relatively small signal to noise ratio margin.

Charge coupled devices wherein signal charge transport in the bulk of the semiconductor body is achieved by the application of control voltages synchronously applied to overlapping metal electrodes formed on the semiconductor body are also well known. It is also known to utilize such devices in imaging systems which are adapted to operate in a time delay and integration mode. Whereas systems employing point detectors have their sensitivity determined by the instantaneous illumination and scan rate of the system which limits the detector bandwidth, a CCD implemented imager operating in the time delay and integration mode significantly improves the signal to noise ratio of such a system.

In one known type of charge transfer imager, the CCD devices are arranged in groups of plural columns in each group with the light sequentially falling on each CCD element of the column which is sequentially read out in time to an output register thereby integrating the light impinging upon the column by a serial addition process whereupon the output register transfers the integrated column output to an output terminal.

SUMMARY

Although the prior art discloses several variations of image sensors utilizing charge coupled devices (CCD elements), the primary object of the present invention is to provide an image sensor which is an improvement over the prior art and which in particular is capable of selectively reversible or bi-directional charge transfer together with a selectively variable integration time.

It is also another object of the present invention to provide an improved multi-stage integration CCD array utilizing buried channel construction and transparent doped tin oxide gates to provide front surface imaging.

It is another object of the present invention to provide an improved CCD imaging array particularly adapted for a multi-spectral scanner contained in a moving platform such as an orbiting satellite.

These and other objects are accomplished in the present invention by a multi-channel matrix array of CCD devices wherein a plurality of CCD devices are linearly arranged in each channel or column which are subdivided and operated as a plurality of independently operable subarrays to which multiphase clock signals are applied in predetermined combinations to effect parallel charge transfer selectively in either direction in the channels. A common readout shift register is provided at both ends of each of the channels to receive charge signal transfer from the subarray channels depending upon the phase manipulation of the clock voltages applied to the specific subarray. Suitable clock voltages are applied to the readout shift registers to serially couple the charge signals applied thereto in parallel to respective output nodes.

BRIEF DESCRIPTION OF THE DRAWING

Other objects and advantages of the present invention will become evident as the following detailed description is considered in light of the accompanying drawing in which.

DESCRIPTION OF THE PREFERRED EMBODIMENT

Figure 1:
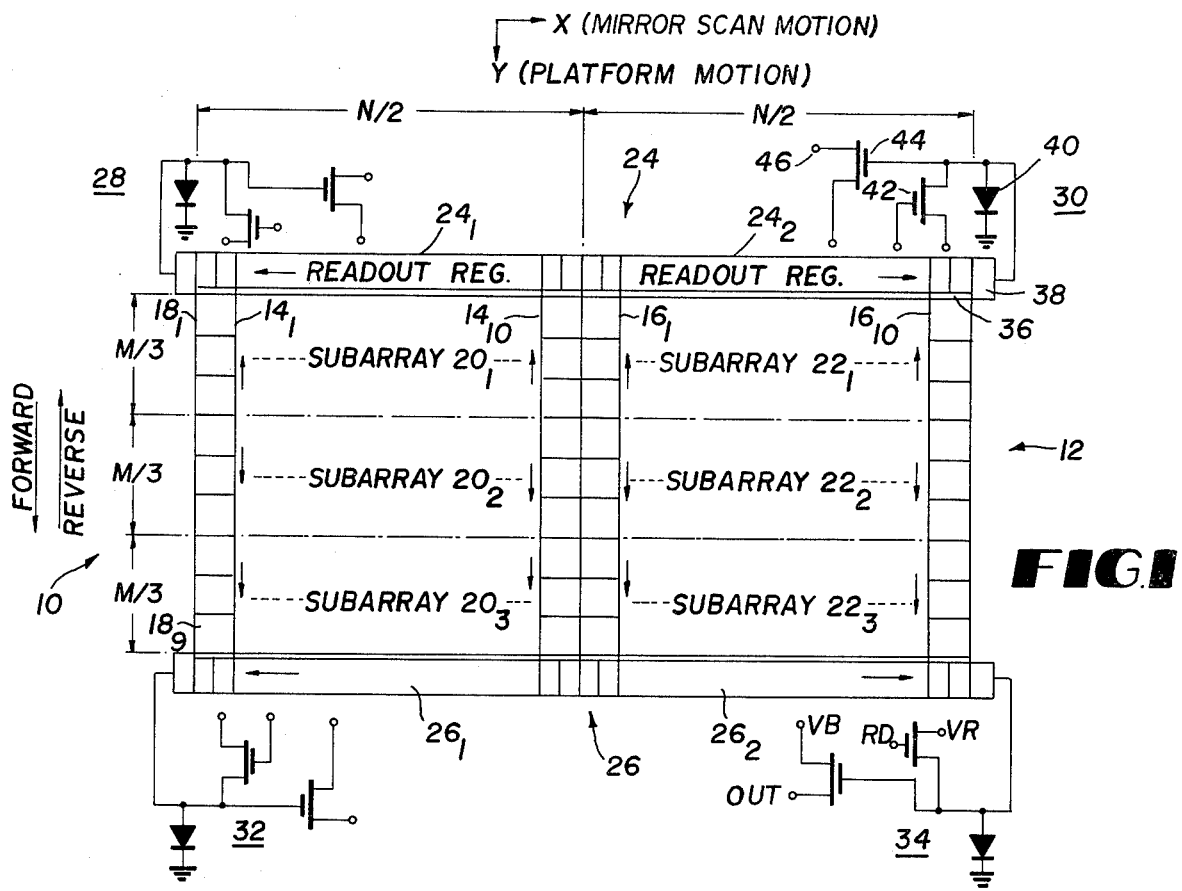
FIG. 1 is a block diagram of the preferred embodiment of the subject invention.

Referring now to the drawings and more particularly to FIG. 1, the block diagram is intended to broadly set forth the preferred embodiment of the subject invention which is adapted to be included in a scanner mounted on a moving platform, not shown, which may be, for example, a satellite moving in the Y direction with the scanner including a scanning mirror, not shown, which nods and sweeps the scene in the X direction. After scanning a swath in the X direction across the surface of the earth, the mirror is reset to its initial position to scan the next path in the X direction. Since mechanical motion is inherent in this application, it is natural to take advantage of an area array operated in the time delay and integration mode.

Accordingly, the preferred embodiment of the subject invention shown in the block diagram in FIG. 1 basically comprises a matrix which consists of N columns of charge coupled devices (CCD) sensor elements with each column being comprised of M sensor stages. It can be seen that as movement progresses in the Y direction, each increment of the image falling on any column $N_i$ is electrically delayed in the Y direction as the scene is scanned across the image plane in the Y direction. If the outputs from all the M elements in a given column $N_i$ are added, then the output signal will be M times larger than that from a single imaging element. This is what is termed the time and integration mode. The basic result is that the signal output is increased by the factor M while the geometrical resolution is substantially unchanged.

The configuration illustrated in FIG. 1 consists of a matrix array of charge coupled devices or simply CCD sensor elements divided in two half sections 10 and 12, each consisting of $N/2=10$ channels $14_1 \ldots 14_{10}$ and $16_1 \ldots 16_{10}$, respectively. Each channel is comprised of $M=9$ CCD sensor stages $18_1 \ldots 18_9$. Each of the two half sections 10 and 12 are separately but synchronously operated as three independent subarrays $20_1$, $20_2$ and $20_3$ and $22_1$, $22_2$ and $22_3$ by the separate application of four phase related clock or scanning signals, not shown, applied on a subarray basis as will be shown subsequently. Each subarray 20, for example, is thus comprised of ten channels, $14_1 \ldots 14_{10}$, each of which includes three sensor elements $18_1$, $18_2$ and $18_3$. As will be shown, by the control of the relative phases of the clock pulses applied separately to the subarrays either one, two or three of the subarrays will transfer charge in one Y direction in the respective channel while the remainder are transferred or scanned in the opposite direction, thus yielding a form of electronic exposure or integration control providing signal multiplication factor of $M=3$, 6 or 9 in a desired selected direction.

Readout register means 24 and 26 is provided at opposite sides of the CCD matrix perpendicular to the ends of the channels $14_1 \ldots 14_{10}$, $16_1 \ldots 16_{10}$. The purpose of the readout registers 24 and 26 is to synchronously receive the charge in a parallel fashion from the two half sections 10 and 12 of CCD channels $14_1 \ldots 14_{10}$ and $16_1 \ldots 16_{10}$ and respectively route the charge serially to separate output signal nodes at the four corners of the matrix array. Each of the readout registers 24 and 26 are also divided into and operated in two sections $24_1$, $24_2$ and $26_1$ and $26_2$ to which are coupled four known identical readout circuits 28, 30, 32 and 34. Each readout circuit includes a column transfer gate 36, a register or sum transfer gate 38, a collection diode 40, and a pair of FET devices 42 and 44 functioning as a reset switch and readout amplifier with the output being provided at terminal 46.

Figure 2:
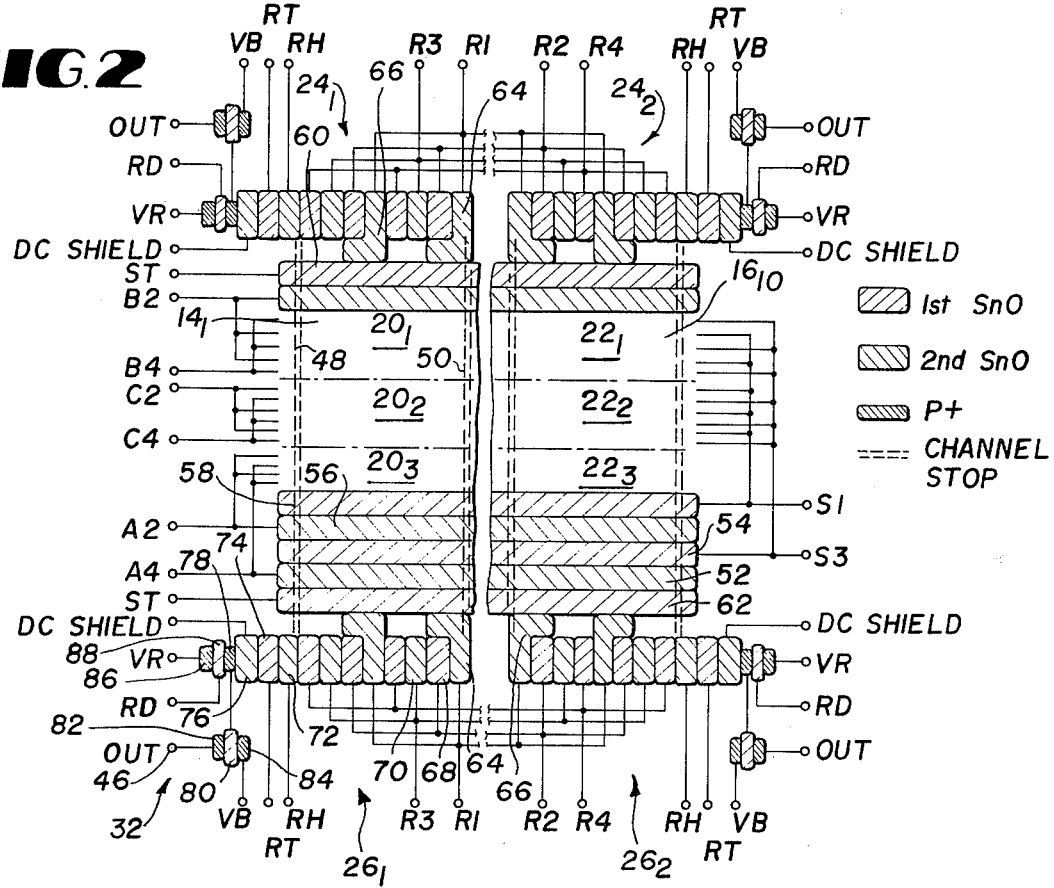
FIG. 2 is a topological semiconductor structure schematic diagram of the embodiment shown in FIG. 1.
Figure 3:
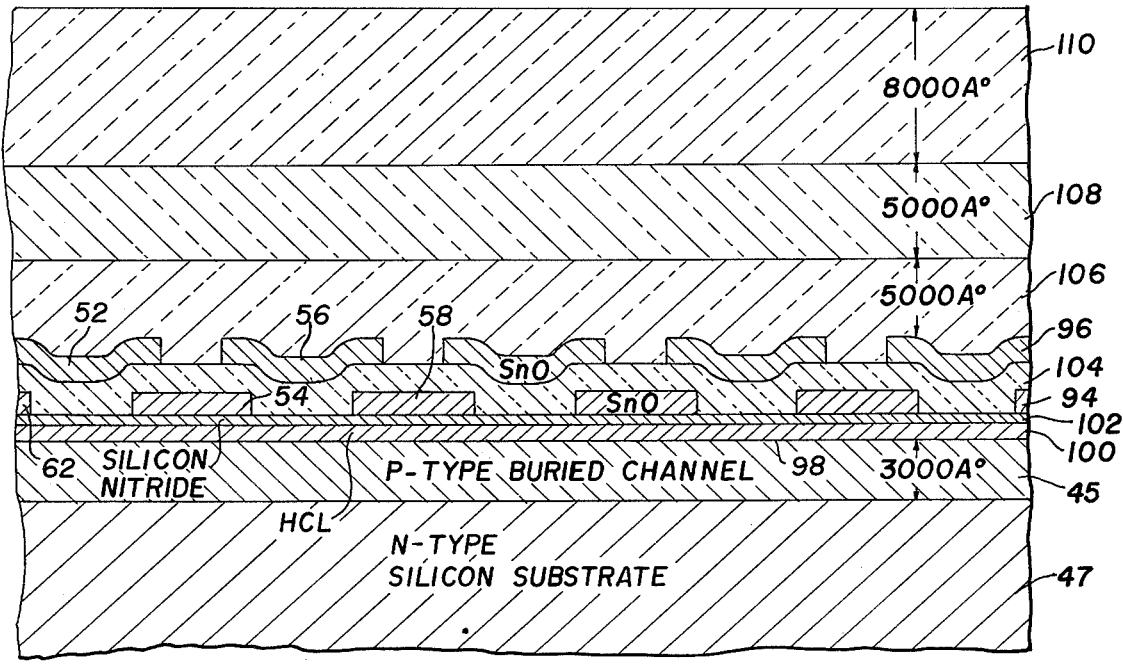
FIG. 3 is illustrative of a partial cross section of the imaging portion of the embodiment shown in FIG. 1 taken along the longitudinal or channel direction.

Referring now to FIG. 2, there is shown the details of the manner in which the embodiment shown in FIG. 1 is physically implemented in a semiconductor structure, a cross section of which is partially shown in FIG. 3. The topological schematic of FIG. 2 is designed to illustrate the physical relationship of overlapping transfer gates and their respective connections to control signals for effecting the flow of charge in a buried channel 45 of an N-type 10–20 $\Omega$-CM<100>silicon substrate 47.

Taking one of the identical channels $14_1$ shown in FIG. 1 as a typical example, it is defined by means of the pair of channel stop diffusions 48 and 50 running lengthwise or in the Y direction. Each CCD sensor element $18_1 \ldots 18_9$ in the M$\times$N matrix array includes four substantially parallel overlapping transparent tin oxide ($S_nO$) electrodes 52, 54, 56, 58 arranged in mutually parallel relationship transverse to the channel stops 48 and 50. The electrodes 52 and 56 are at a upper level, while electrodes 54 and 58 are at a lower level as shown in FIG. 3. This pattern is repeated for all of the sensor elements in the three subarrays $20_1$, $20_2$, and $20_3$, bearing in mind that the same configuration exists for subarrays $22_1$, $22_2$ and $22_3$ on the right side of the matrix. At each end of the channel $18_1$, a transfer gate electrode 60 and 62 implementing column transfer gate 36 (FIG. 1) is provided at the first level to couple charge from the channel to the respective adjacent readout register $24_1$ and $26_1$. The transfer gates 60 and 62 are adapted to couple the charge from the ends of the channel to L-shaped electrodes 64 and 66. In addition to the L-shaped electrodes, alternate gate segments 68 and 70 oriented in parallel relationship transverse to the sensor electrodes are adapted via a four phase clock system to translate the charge to the respective corner output circuit. Each transfer gate electrode 60 or 62 and the two L-shaped electrodes 64 and 66 effectively split the output charge column between the two cells and effectively increase the transfer efficiency.

The output circuit, for example, circuit 32, includes two electrodes 72 and 74 for implementing a transfer well and a summing well as well as a third electrode 76 for providing a DC shield. The summing well is provided to receive the charge from the readout register $26_1$ while the transfer well enables the charge to flow from the holding well. The DC shield serves to act as a shield to the output terminal 46 from any pulse feedthrough from the transfer gate 62. The collection diode 40 shown in FIG. 1 is comprised of a P+ diffusion region 78 which is coupled to an electrode 80 between two P+ diffusion regions 82 and 84, which implements the readout output amplifier 44 shown in FIG. 2. The reset switch 42 is comprised of the diffusion regions 78 and 86 on opposite sides of the electrode 88.

Charge transfer in each of the three columnar sensor elements in the subarray $20_3$ is directed to either end of the column $18_1$ by selective application of four phase (40) related clock signals $S_1$, $A_2$, $S_3$, and $A_4$, respectively applied via suitable interconnects to the electrodes 58, 56, 54 and 52. The CCD sensor elements in the subarray $20_2$ have its charge transfer controlled by four clock voltages S1, C2, S3 and C4. Similarly, the CCD sensors in the subarray $20_1$ have their charge transfer controlled by the clock signals S1, B2, S3 and B4. By maintaining clock signals S1 and S3 fixed in phase while manipulating the phase relationships of the clock signals A2, A4, C2, C4, B2 and B4, separate directional control of the charge flow in the column $14_1$ in either direction to the transfer gate electrodes 60 and 62 will result. This is accomplished in the following manner as will become evident in view of Table I.

TABLE I

| MODE | MODE PHASE CONTROLS | | | | | | |
|---|---|---|---|---|---|---|---|
| | INTEGRATION TIME MULTIPLIER | A2 | A4 | C2 | C4 | B2 | B4 |
| Forward | M = 3 | V2 | V4 | V4 | V2 | V4 | V2 |
| | M = 6 | V2 | V4 | V2 | V4 | V4 | V2 |
| | M = 9 | V2 | V4 | V2 | V4 | V2 | V4 |
| Reverse | M = 3 | V2 | V4 | V2 | V4 | V4 | V2 |
| | M = 6 | V2 | V4 | V4 | V2 | V4 | V2 |
| | M = 9 | V4 | V2 | V4 | V2 | V4 | V2 |

Assuming that four clock voltages S1, S3, V2 and V4 (FIG. 4) are available and signals S1 and S3 being constantly applied in fixed phase relationship, the application of the clocks V2 and V4 for the signals A2 ... B4 as specified in Table I will cause flow in either direction within the respective subarray with a resulting variable integration multiplier factor of $M=3$, 6 or 9, depending upon the application of the clock voltages.

Considering the column $18_1$ (FIG. 1) and a charge transfer to the readout register section $26_1$ constitutes the forward direction, the numeral $M=3$ forward mode would cause the charge transfer only from the subarray $20_3$ to the readout register $26_1$. However, note should also be taken that the same combination of clock voltages of V2 and V4 exists for the M=6 reverse direction, meaning that the charge in the subarrays $20_2$ and $20_1$ will flow to the opposite readout register $24_1$. In the same manner, the M=6 forward mode will also exist concurrently with the M=3 reverse mode, indicating that in any operating mode, the charge transfer in the subarrays $20_1$ and $20_2$ and $20_3$ occur in one direction or the other, depending upon the phase relationships of the voltages B2 and B4, thereby providing controlled reversible scanning. Thus, if only a three sensor (one subarray) output is desired, the remaining two subarrays have their columns clocked in the reverse direction, thus routing their signal to the reverse readout register and output circuit which is undetected i.e. unused.

Figure 4:
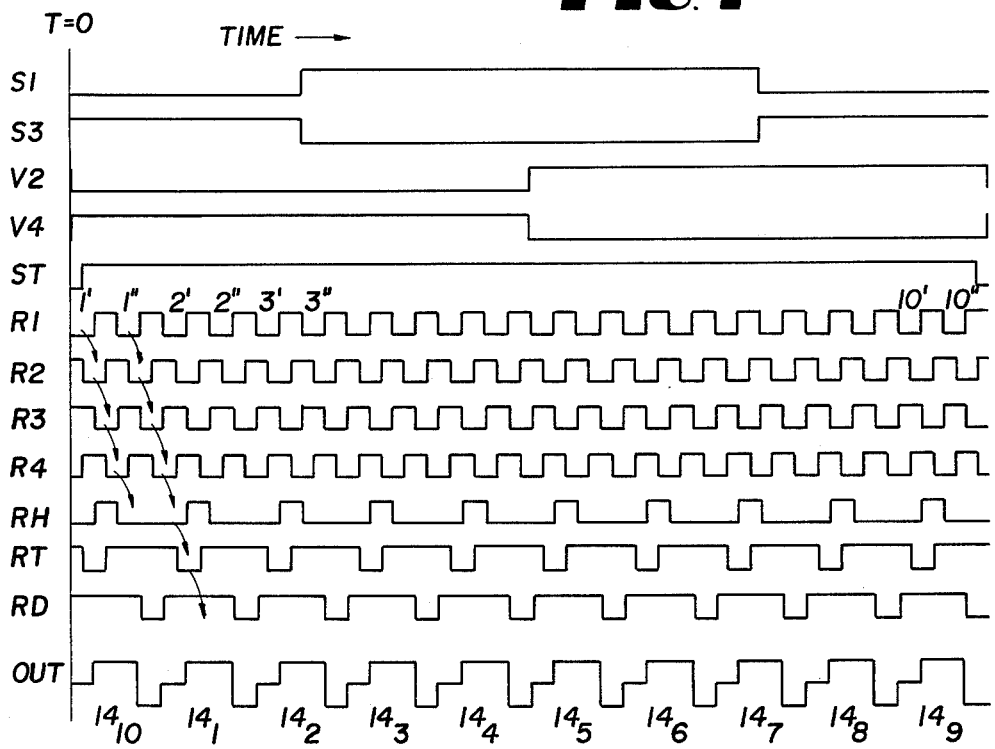
FIG. 4 is a timing diagram illustrative of time related waveforms helpful in understanding the operation of the subject invention.

As is well known, charge contained in a well under a gate electrode is held thereat when the clock voltage applied thereto is negative, but is then transferred to a well under an adjacent gate when the clock voltage rises and the adjacent clock voltage falls. Thus as the clock voltages rise and fall in synchronism, the charge is selectively transferred to either of the transfer gates 60 and 62 which has a signal ST (FIG. 4) applied thereto, which when it is high transfers the charge into the readout registers 24 and 26 which operate in accordance with the application of four phase clock voltages $R_1$, $R_2$, $R_3$ and $R_4$ (FIG. 4). As shown in the timing diagram of FIG. 4, the square wave clock voltages $R_1$ through $R_4$ illustrates the dual or split charge under the four gates of the last readout register as a function of time. This timing is also common to all similar electrodes of the readout register on the opposite ends of the columns $14_1 \ldots 14_{10}$ and $16_1 \ldots 16_{10}$. As the split charge is received by the L-shaped electrodes 64 and 66, it is moved through sets of four electrodes of the shift register in sequence by the application of signals R1, R2 and R3 until it reaches the holding well under the electrode 72 to which is applied the signal RH. After two cycles of the clock voltages R1 . . . R4, both halves of the charge from any column of CCD sensors $18_1 \ldots 18_9$ have been placed in the holding well. As the signal RH rises, the charge is transferred to the transfer well 74 which has the signal RT applied to the electrode 74. When the transfer gate signal RT rises, the charge is coupled to the output diode diffusion 78 through the DC shield of electrode 76, which has a DC shield voltage applied thereto. Following this transfer of charge and prior to the next drop in the RT gate voltage to accept more charge, the reset switch 44 is activated by a signal RD which when it goes negative restores the diode to its initial condition. This operation is repeated summing, transferring, and resetting until all ten channel, for example $14_1 \ldots 14_{10}$ outputs have been read and the cycle is repeated.

As to the structural features of the subject invention, each sensor element or pixel is one cell of a four phase CCD constructed with transparent tin oxide electrodes in accordance with the cross sectional illustration of FIG. 3. As noted above, the preferred embodiment is fabricated on an N-type silicon substrate 47 having a buried channel 45. This channel is comprised of a 3000 Å deep channel fabricated by means of implanted boron. Two levels of transparent tin oxide electrodes are fabricated over the channel 45. The first level 94 is adapted to implement the transfer electrode 62 as well as the electrodes 54 and 58 of the subarray $20_3$ shown in FIG. 2, while the second level 96 is adapted to implement the control electrodes 52 and 56. Metal interconnects, not shown, are applied in accordance with the topological schematic shown in FIG. 2. Between the silicon surface 98 and the first layer 94 of tin oxide electrodes is a layer 100 of 800 Å of HCL thermal silicon dioxide over which is formed a layer 102 of silicon nitride 400 Å in thickness. The thickness of the first tin oxide electrode layer 94 is 1200 Å, while the overlying or second tin oxide layer 96 is 1500 Å. These layers are separated by a region of undoped deposited glass 104 consisting of silox. The entire array is covered by 5000 Å of undoped deposited glass as designated by reference numeral 106. This layer is adapted to accommodate a first level of aluminum interconnects, not shown. Over the silox layer 106 is formed a second layer 108 of undoped silox having a thickness of 5000 Å, over which is formed 8000 Å layer 110 of phosphorus doped silox, the latter layer being adapted to receive an aluminum light shield, not shown, which is adapted to confine the sensitivity to the desired imaging regions.

Thus what has been shown and described is a front surface imaging array of CCD elements constructed with phase electrodes of transparent tin oxide which is adapted to operate in the time delayed integration mode of operation in both the visible and near infra-red spectrums by selectively applying charge transfer control voltages to discrete subarrays of CCD sensor elements in any channel to cause transfer of these subarrays in one direction, while the remainder are transferred in the opposite direction to respective readout registers at opposite ends of the channel to thereby not only provide reversible scanning, but selective integration factors of the video output.

While there has been shown and described what is at present considered to be the preferred embodiment of the invention, modifications thereto will readily occur to those skilled in the art. It is not desired, therefore, that the invention be limited to these specific arrangements shown and described, but it is to be understood that all equivalents, alterations and modifications within the spirit and scope of the present invention are herein meant to be included.

We claim as our invention:

1. A charge transfer imaging system operable in a variable time delay and integration mode, comprising in combination:

a matrix of plural photosensitive charge transfer elements arranged in a selected number of interconnected subarrays having plural charge signal channels along one direction of the matrix, each channel being comprised of a number of elements from each of the subarrays;

control means coupled to said subarrays for independently controlling the translation of charge signals in the respective channels bidirectionally within each subarray and where the direction of charge flow in each element comprising each channel may be selectively reversed; and circuit means coupled to each end of said channels and being operable to respectively receive in parallel and serially output charge signals from said channels to an output node at opposite ends of the matrix in response to the controlled translation direction of the charge signals within said channels.

2. The system as defined by claim 1 wherein said circuit means includes charge transfer shift register means coupled to each end of said channels.

3. The system as defined by claim 2 wherein said circuit means includes charge transfer readout circuit means coupled to said shift register means, said readout circuit means including a series coupled holding well and a transfer well for summing split charge signals coupled to said shift register and for transferring the summed charge signals to said output node.

4. The system as defined by claim 1 wherein said control means comprises means for providing parallel synchronous charge translation in the respective channels of each subarray.

5. The system as defined by claim 4 wherein said control means comprises a four phase clock system, two phases of which are constantly applied in fixed phase relationship to each subarray while the other two phases are applied in a first variable phase relationship to said subarray relative to said two phases to effect charge translation in one direction in said channels and applied in a second phase relationship to effect charge translation in the reverse direction in said channels.

6. The system as defined by claim 1 wherein said matrix of elements is divided into plural sets of plural subarrays wherein each set of subarrays is separately but synchronously operated.

7. The system as defined by claim 6 wherein each subarray includes N/2 columns of elements defining respective charge signal channels where N is the number of columns in said matrix of charge transfer elements of N columns and M rows.

8. The system as defined by claim 6 wherein said shift register means at each end of said channels comprises first and second shift registers each coupled to N/2 columns of elements and being operable to translate charge signals coupled thereto in mutually opposite directions.

9. The system as defined by claim 6 wherein each set of subarrays includes at least three subarrays, each said subarray having a plurality of columns defining respective charge signal channels and at least one row of elements whereby at least one translation stage per signal channel is provided within each subarray column.

10. The system as defined by claim 6 wherein each set of subarrays includes at least three subarrays, each said subarray having a plurality of columns defining respective charge signal channels and at least three rows of elements whereby three translation stages per signal channel are provided within each subarray column.

11. The system as defined by claim 1 wherein said subarrays have an equal number of charge transfer elements in each channel.

12. The system as defined by claim 1 wherein said matrix of photosensitive semiconductor charge transfer elements are formed on a substrate having a buried channel therein over which are formed transparent charge transfer electrodes.

13. The system as defined by claim 12 wherein said transparent electrodes are comprised of tin oxide transparent electrodes.

14. The system as defined by claim 12 wherein said tin oxide transparent electrodes are multilayered with the use of appropriate layers of intervening insulation.

15. The system as defined by claim 1 wherein the controlling of the translation of charge signals is accomplished in synchronism with the scanning action of an optical mirror in order to coherently integrate said charge signals.

16. The system as defined by claim 1 wherein said matrix is divided into sets having equal numbers of subarrays, each set of subarrays having equal numbers of channels and each channel having equal numbers of charge transfer elements.

17. The system as defined by claim 16 wherein said sets are two in number, each set has three subarrays, each set of said subarrays has ten channels and each of said columns has ten elements.

18. A charge transfer imaging system comprising in combination:

a matrix of interconnected plural photosensitive charge transfer elements having plural charge signal channels along one direction of the matrix, each channel being comprised of a plurality of elements;

control means for controlling the translation of charge signals in different portions of the respective channels bidirectionally within said matrix and where the direction of charge flow in each element comprising each channel may be selectively reversed; and means for operating said system in a variable time delay and integration mode by selecting and varying the number of said elements whose charge is to be summed.

* * * * *